(12) United States Patent
Fleischhacker et al.

(10) Patent No.: US 11,159,193 B2
(45) Date of Patent: Oct. 26, 2021

(54) TIME DIVISION DUPLEXING RECEIVER WITH CONSTANT IMPEDANCE FOR A BROADBAND LINE TERMINAL WITH ASYNCHRONOUS TRANSMISSION

(71) Applicant: Intel IP Corporation, Santa Clara, CA (US)

(72) Inventors: Christian Fleischhacker, Villach (AT); Rainer Strobel, Munich (DE)

(73) Assignee: MaxLinear, Inc., Carlsbad, CA (US)

( * ) Notice: Subject to any disclaimer, the term of this patent is extended or adjusted under 35 U.S.C. 154(b) by 798 days.

(21) Appl. No.: 15/622,728

(22) Filed: Jun. 14, 2017

(65) Prior Publication Data
US 2018/0019783 A1    Jan. 18, 2018

Related U.S. Application Data

(60) Provisional application No. 62/362,448, filed on Jul. 14, 2016.

(30) Foreign Application Priority Data

Oct. 26, 2016    (EP) .................................... 16195777

(51) Int. Cl.
*H04B 1/44*    (2006.01)
*H04L 25/02*    (2006.01)
(Continued)

(52) U.S. Cl.
CPC .............. *H04B 1/44* (2013.01); *H03H 11/28* (2013.01); *H04B 3/32* (2013.01); *H04L 5/14* (2013.01);
(Continued)

(58) Field of Classification Search
None
See application file for complete search history.

(56) References Cited

U.S. PATENT DOCUMENTS 5,936,393 A  *  8/1999  Nauta ................... H04L 25/028
                                                     323/316
6,766,404 B1 *  7/2004  Osaka ................. G06F 13/4077
                                                     710/306
(Continued)

FOREIGN PATENT DOCUMENTS

EP        2866399 A1 *  4/2015

*Primary Examiner* — Noel R Beharry
*Assistant Examiner* — Rodrick Mak
(74) *Attorney, Agent, or Firm* — Maschoff Brennan (57) ABSTRACT

A line driver circuit has first and second differential input terminals and first and second differential output terminals, and is configured to interface with first and second termination impedances coupled between the first and second differential output terminals, respectively, and first and second transmit chain output terminals, respectively. The line driver circuit includes an amplifier circuit having first and second input terminals coupled to the first and second differential input terminals of the line driver circuit, respectively, and first and second output terminals coupled to the first and second differential output terminals of the line driver circuit, respectively, and an impedance switching circuit coupled between the first and second output terminals of the amplifier circuit. The impedance switching circuit switches between a first switching mode and a second switching mode, wherein in the first switching mode a first switching configuration is established resulting in a first output impedance.

14 Claims, 3 Drawing Sheets

(51) Int. Cl.
  *H03H 11/28* (2006.01)
  *H04B 3/32* (2006.01)
  *H04L 5/14* (2006.01)

(52) U.S. Cl.
  CPC ...... *H04L 25/0272* (2013.01); *H04L 25/0278* (2013.01)

(56) References Cited

U.S. PATENT DOCUMENTS

| | | | | |
|---|---|---|---|---|
| 7,626,452 | B2 * | 12/2009 | Chen | H02P 7/04 257/E27.005 |
| 2002/0186041 | A1 * | 12/2002 | Metz | H04L 25/0298 326/30 |
| 2003/0201759 | A1 * | 10/2003 | Cern | H04B 3/56 323/247 |
| 2004/0113872 | A1 * | 6/2004 | Nanno | G09G 3/3266 345/76 |
| 2004/0218754 | A1 * | 11/2004 | Barkaro | H04B 3/03 379/406.01 |
| 2006/0006912 | A1 * | 1/2006 | Leonowich | H04L 25/0278 327/112 |
| 2006/0267683 | A1 * | 11/2006 | Liu | H03F 1/0277 330/51 |
| 2008/0117956 | A1 * | 5/2008 | Kumar | H04L 25/0278 375/220 |
| 2009/0212855 | A1 * | 8/2009 | Mitchell | H03F 3/45475 327/552 |
| 2009/0237122 | A1 * | 9/2009 | Wenske | H04L 25/0264 327/108 |
| 2011/0103441 | A1 * | 5/2011 | Zhang | H03F 1/56 375/222 |
| 2013/0076436 | A1 * | 3/2013 | Chiaburu | H04L 25/0278 330/105 |
| 2013/0162301 | A1 * | 6/2013 | Swaminathan | H04L 25/0272 327/108 |
| 2013/0169316 | A1 * | 7/2013 | Lee | H04L 25/0278 327/108 |
| 2013/0294294 | A1 * | 11/2013 | Pan | H04B 1/586 370/276 |
| 2015/0103981 | A1 * | 4/2015 | Berg | H04M 3/306 379/1.04 |

* cited by examiner

Fig. 6 ated in one or more virtual machines, etc. Furthermore, an article of manufacture can include a computer program accessible from any computer-readable device, carrier, or storage media. For example, computer readable storage media can include but are not limited to magnetic storage devices (e.g., hard disk, floppy disk, magnetic strips), optical disks (e.g., compact disk (CD), digital versatile disk (DVD)), smart cards, and flash memory devices (e.g., card, stick, key drive), etc.

TIME DIVISION DUPLEXING RECEIVER WITH CONSTANT IMPEDANCE FOR A BROADBAND LINE TERMINAL WITH ASYNCHRONOUS TRANSMISSION

REFERENCE TO RELATED APPLICATION

This application claims priority to U.S. Provisional Application 62/362,448 filed on Jul. 14, 2016, and European Patent Application 16195777.4 filed on Oct. 26, 2016, which are hereby incorporated by reference in its entirety.

FIELD

The present disclosure relates to wireline communication, and line driver circuitry exhibiting substantially constant impedance when switching between a transmit mode and a receive mode.

BACKGROUND

Conventional systems for data transmission on twisted pair cables transmitted data continuously, using frequency division duplexing to separate upstream and downstream directions. Consequently, the electrical characteristics of the transmitter and the receiver did not change appreciably over time. G.fast, which is a next generation copper access technology, uses time division duplexing, which requires driver circuitry to switch between a transmit mode and a receive mode. Consequently, the electrical characteristics such as the output impedance of the line driver circuitry is not constant when switching between the transmit mode, the receive mode and an idle mode (where no signal is transmitted or received).

SUMMARY

According to some embodiments, a line driver circuit as defined in claim 1 or a method as defined in claim 13 are provided. The dependent claims define further embodiments and a transceiver comprising such a line driver circuit.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC, an electronic circuit and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more".

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Figure 6:
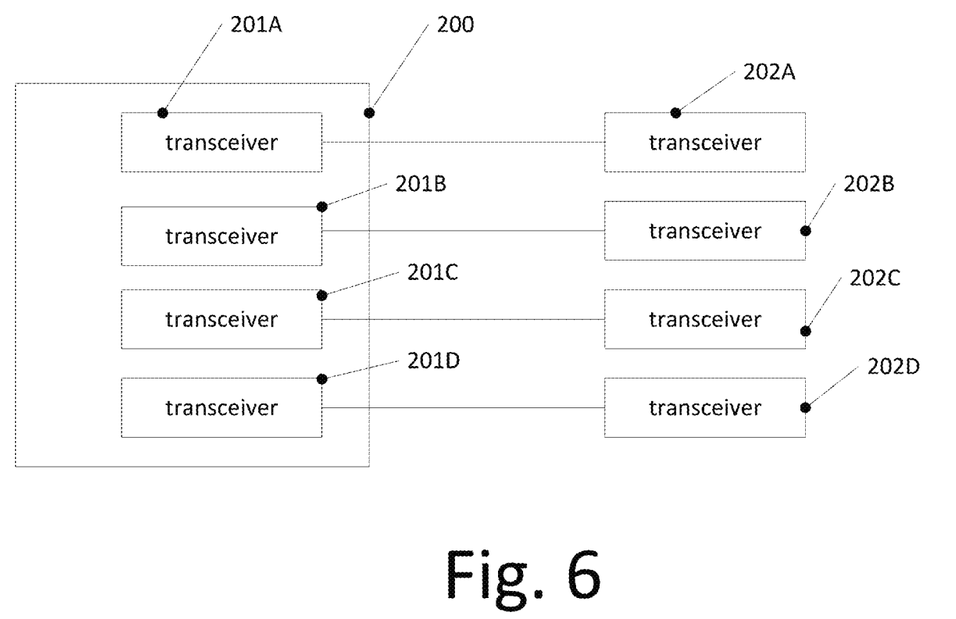
FIG. 6 is a diagram illustrating a communication system according to an embodiment.

In many deployment scenarios, data transmission for multiple subscribers uses a shared cable binder such that the individual transmitters and receivers in the various data lines in the cable binder influence each other. This influence is not only due to cross talk (i.e., when the transmit signal is coupled from one data line to another), but also due to impedance changes on the respective data lines. FIG. 6 illustrates an example of a system according to an embodiment where line driver circuits as described later in more detail may be used.

The system of FIG. 6 comprises a provider equipment 200 communicating with a plurality of customer premises transceivers 202A-202D via a plurality of respective data lines, for example copper lines. For each line, in provider equipment a respective transceiver 201A-201D is provided. While four transceivers 201A-201D, four lines and four transceivers 202A-202D are shown in FIG. 6, this number is merely an example, and any number may be provided, including a single transceiver 201A and a single transceiver 202A. Some or all of the data lines may run in a common cable binder for at least part of their length, which makes them prone to crosstalk.

Provider equipment 200 may for example be or form part of a street cabinet, a distribution point, a digital subscriber line access multiplexer (DSLAM) or any central office (CO) equipment. Communication via the data lines may for example be any xDSL (digital subscriber line) communication like G.fast according to ITU-T recommendation G.9701 of January 2015 or VDSL according to ITU-T G.993.2 of January 2015, possibly using vectoring as defined in ITU-T G.993.5 of January 2015. Different data lines may use different standards. For example, some lines may use G.fast, while others may use VDSL or another xDSL standard like ADSL or ADSL2.

A changing output impedance on one data line has the ability to change the transmission characteristics of one or more data lines in the bundle of cables or even affect the complete cable bundle. This alteration of transmission characteristics may also affect the transmission quality on the other data lines of the cable binder. Output impedance as used herein refers to the impedance of a line driver circuit used in transceivers like transceivers 201A-201D or 202A-202D as seen by the respective data line.

Further, the mutual influence does not only occur between G.fast lines, but the impedance change on a G.fast line due to the time division duplexing operation also affects legacy services such as VDSL2. Therefore the present disclosure is directed to a transceiver design having line driver circuitry that does not exhibit a substantial change in impedance when changing between a transmit mode and a receive mode, as is common in the TDD architecture.

The present disclosure is directed to a line driver circuit that is configured to transmit and receive signals on a data line such as a broadband data line that is subject to crosstalk. The line driver circuit comprises an amplifier circuit that switches on and off for asynchronous communication and is configured to be coupled to terminals of the line driver circuit. In such circuitry, the impedance across the terminals of the line driver circuit is maintained substantially constant so that the crosstalk on the broadband data line (e.g., with other data lines in a cable bundle) is substantially maintained and not increased due to switching of the line driver circuit, for example, between a transmit mode and a receive mode.

In one embodiment, the line driver circuit is configured to exhibit a substantially constant impedance such that a linearity of harmonic distortion is maintained.

In one embodiment, the line driver circuitry is incorporated into a single chip.

In one embodiment, the line driver circuitry is configured to provide drive signals that comport with the G.fast standard.

In one embodiment, the line driver circuitry is configured to be included in a hybrid DSL/G.fast type system.

Figure 1:
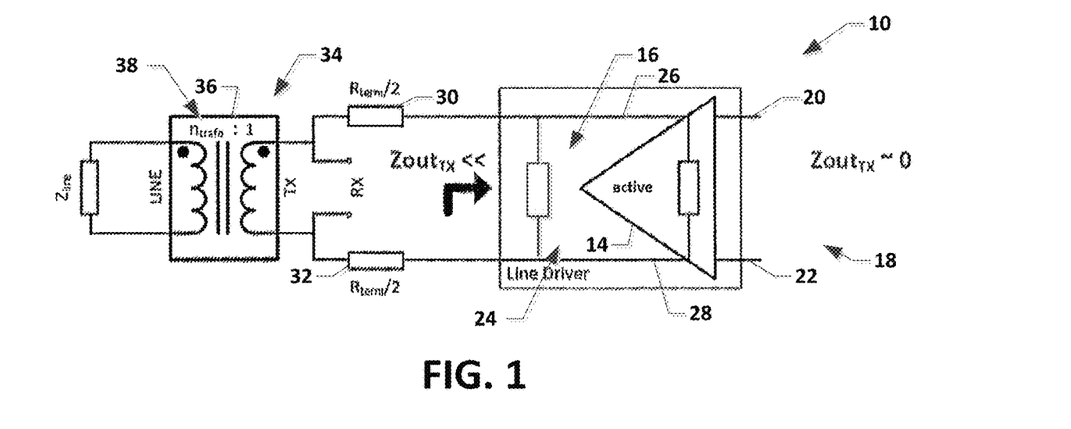
FIG. 1 is a schematic diagram illustrating a line driver circuit in a transmit mode according to one embodiment of the disclosure.

Referring now to the figures, FIG. 1 illustrates an end portion 10 of a transmit chain for a transceiver, wherein other components thereof are not shown for purposes of simplicity. The end portion 10 comprises a line driver circuit 24 that includes an amplifier 14 and an impedance converter circuit 16, also referred to as impedance switching circuit, at an output thereof. The amplifier circuit 14 comprises a differential input 18 comprising first and second input terminals 20, 22, and a differential output 24 comprising first and second output terminals 26, 28. As shown in FIG. 1, the impedance converter circuit 16 is coupled between the first and second output terminals 26, 28 of the amplifier circuit 14. At the output of the line driver circuit 24, an output impedance Zout is established, as will be more fully appreciated below, the output impedance Zout will be a function of the state of the impedance converter circuit 16.

At the first and second output terminals 26, 28 first and second termination impedances 30, 32 are coupled at their first terminals, while second terminals of the first and second termination impedances 30, 32 connect to opposing terminals of a first winding 34 of a transformer 36. Opposing terminals of a second winding 38 of the transformer 36 are coupled to the load that characterizes the line impedance Zline.

As highlighted earlier, in some instances, such as a TDD operation mode, the line driver circuit 24 switches between a transmit mode and a receive mode. In the transmit mode, the amplifier circuit 14 is activated and the impedance converter circuit 16 establishes a first impedance configuration by switching to a first switching mode. In one embodiment, the first impedance configuration establishes a transmit mode output impedance that is substantially equal to zero (i.e., Zout(TX)≈0). This advantageously facilitates maximum transfer of the differential output signal to the load.

Figure 2:
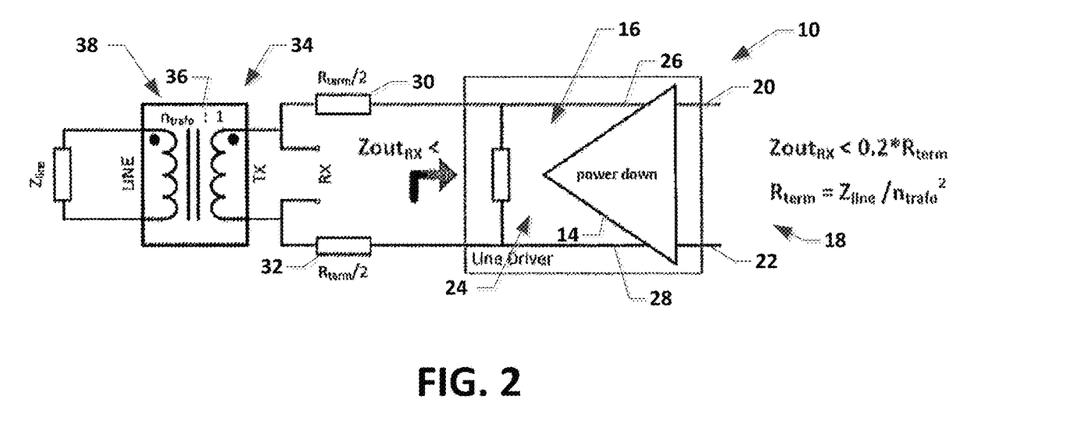
FIG. 2 is a schematic diagram of a line driver circuit in a receive mode according to one embodiment of the disclosure.

In FIG. 2, the end portion 10 is illustrated with the line driver circuit 24 in a receive mode. When the line driver circuit 24 switches from the transmit mode to the receive mode, the amplifier circuit 14 is deactivated. By itself, the amplifier in this deactivated or power down state has a high output impedance, for example in the kiloohm range. The impedance converter circuit is configured to establish a second, different impedance configuration by switching to a second switching mode. In one embodiment the second, different impedance configuration establishes a receive mode output impedance as the output of the amplifier circuit 14. According to one embodiment the change in the output impedance at the output of the amplifier circuit 14 (including the effect of impedance converter circuit 16) is very small so as to be considered effectively constant. For example, while the transmit output mode impedance is substantially zero, the receive mode output impedance is configured by the impedance converter circuit 16 to be less than 50%, for example less than 20% of a termination impedance as defined by the first and second termination impedances. In one example, the first and second termination impedances 30, 32 are Rterm/2, wherein Rterm=Zline/$n_{turn}^2$ so that the termination impedances are driven by the line impedance and the number of turns of the secondary winding 38 of the transformer 36. By maintaining ZoutRX<0.5 or 0.2Rterm, the change in output impedance when switching between transmit and receive modes is sufficiently small to not adversely alter a crosstalk characteristic of other lines in the same binder. However, in other embodiments the variation in impedance may be greater, depending on requirements. For example, even a ZoutRX=Rterm may reduce the impedance variation between transmit mode and receive mode compared to a case without impedance switching circuit 16. Impedance converter circuit may also improve a linearity for a receive (RX) signal at secondary winding 38 (for example multi-tone power ratio MTPR<−64 dB as required in ITU-T G.9701 Amendment 2). This may improve performance of receive circuitry like an analog frontend (AFE) coupled to RX terminals shown in FIG. 2.

Figure 3:
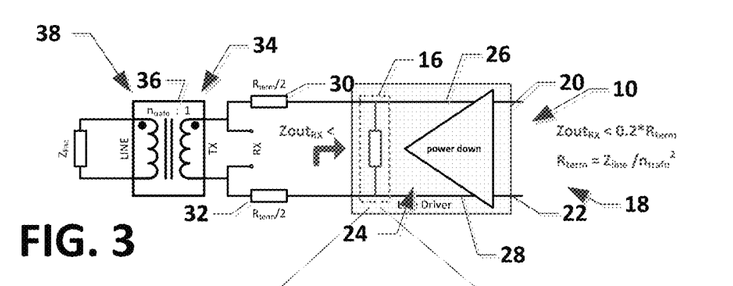
FIG. 3 is a schematic diagram of the line driver circuit in the receive mode.
Figure 4A:
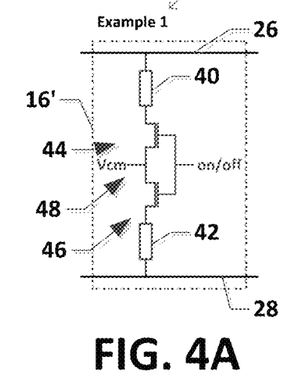
FIGS. 4A and 4B are schematic diagram illustrating details of an impedance converter circuit within a line driver circuit according to embodiments of the disclosure.
Figure 4B:
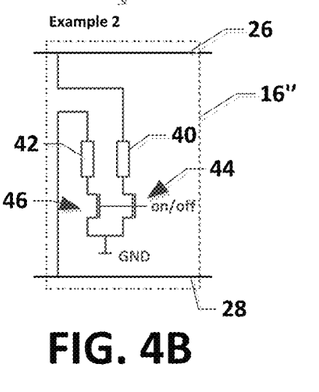

As stated above, the impedance converter circuit 16 is an impedance switching circuit to establish first and second impedance configurations associated with transmit and receive output impedances, respectively. FIG. 3 shows the line driver circuit 24 in the receive mode, wherein two embodiments of the impedance converter circuit 16 is illustrated in FIGS. 4A and 4B, respectively. In FIG. 4A, the impedance converter circuit 16' comprises components that are coupled between the output terminals 26, 28 of the amplifier circuit 14. In one embodiment the circuit components comprise first and second impedances 40, 42 and first and second switches 44, 46, respectively. The first and second switches 44, 46 comprise transistor devices in one embodiment that are connected in series at a node connection 48. In one embodiment the node connection is connected to a common mode voltage Vcm having a value dictated by the design (e.g., depending on whether one wishes to operate as a single ended or differential type design). The control terminals of the transistors are connected together in one embodiment so that the transistors 44, 46 turn on or turn off concurrently. Alternatively, such transistors may be controlled independently.

In the first impedance configuration associated with the transmit mode, the transistors 44, 46 are off, thereby making the impedance of the impedance converter circuit 16' substantially infinite, with such infinite impedance being in parallel with the output impedance of the amplifier circuit 14, which is substantially zero. Thus the first impedance configuration is activated when switching to the transmit mode.

In the second impedance configuration associated with the receive mode the transistors 44, 46 are on, thereby making the impedance of the impedance converter circuit 16' effectively the impedance of the two series-connected impedances 40, 42. This impedance is then coupled in parallel with the output impedance of the amplifier circuit 14 (that has been deactivated in the receive mode and thus is extremely large) and consequently the impedance of the impedance converter circuit dominates to establish an output impedance <50% or 20% of Rterm, although other relationships are also possible. This change in impedance when switching between the transmit mode and the receive mode is small enough (e.g., substantially constant or less than a desired or required threshold) that the impedance change does not alter the crosstalk characteristics in the bundle of lines.

FIG. 4B is similar to FIG. 4A with first and second impedances 40, 42 and first and second switches 44, 46 (e.g., transistors) connected together in series, with a node connection coupled to circuit ground (GND). In this manner, the voltages across the impedances 40, 42 are balanced and the amplifier circuit 14 operates in a differential fashion. The transistor 44, 46 turn on and off together in one embodiment or independently in another embodiment, when switching between the transmit and receive modes.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
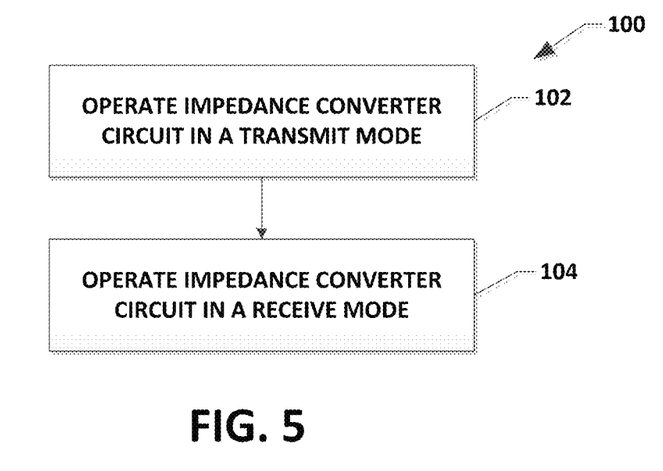
FIG. 5 is a flow chart diagram illustrating a method of operating a line driver circuit when switching between transmit and receive modes according to one embodiment of the disclosure.

FIG. 5 is a flow chart illustrating a method 100 operating a line driver circuit. The method comprises operating an impedance converter circuit at an output of an amplifier in a transmit mode during a transmit operation, wherein the amplifier is activated, wherein the impedance converter circuit establishes a first impedance configuration during the transmit operation at 102. The method 100 continues at 104 with operating the impedance converter circuit at the output of the amplifier in a receive mode during a receive operation, wherein the amplifier is deactivated, wherein the impedance converter circuit establishes a second, different impedance configuration during the transmit operation. In this instance the magnitude of a difference between a first output impedance of the line driver circuit based on the first impedance configuration and a second output impedance of the line driver circuit based on the second impedance configuration is less than a predetermined threshold so as to substantially maintain a crosstalk performance characteristic associated therewith when the line driver circuit switches between the transmit mode and the receive mode.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Non-limiting examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a line driver circuit having first and second differential input terminals and first and second differential output terminals, the line driver circuit configured to interface with first and second termination impedances coupled between the first and second differential output terminals, respectively, and first and second transmit chain output terminals, respectively. The line driver circuit comprises an amplifier circuit having first and second input terminals coupled to the first and second differential input terminals of the line driver circuit, respectively, and first and second output terminals coupled to the first and second differential output terminals of the line driver circuit, respectively, and an impedance switching circuit coupled between the first and second output terminals of the amplifier circuit. The impedance switching circuit is configured to switch between a first switching mode and a second switching mode, wherein in the first switching mode a first switching configuration is established resulting in a first output impedance at the first and second differential output terminals, wherein the first output impedance is substantially zero, and wherein in the second switching mode a second switching configuration is established resulting in a second output impedance at the first and second output terminals, wherein the second impedance may be less than about 50% or 20% of a termination impedance as defined by the first and second termination impedances, but is not limited thereto.

In an Example 2 that depends upon Example 1, wherein the impedance switching circuit comprises a first impedance, a first switch coupled in series with the first impedance, a second switch connected in series with the first switch at a connection node, and a second impedance connected in series with the second switch. In the first switching configuration the first and second switches are open, resulting in the impedance switching circuit operating as an open circuit at the first and second output terminals of the amplifier circuit.

In an Example 3 that depends upon Example 2, in the second switching configuration the first and second switches are closed, thereby effectively connecting the first and second impedance together in series between the first and second output terminals of the amplifier circuit.

In an Example 4 that depends upon Example 3, the line driver circuit further comprises a common mode voltage coupled to the connection node between the first and second closed switches, thereby balancing a voltage drop across the first and second impedances.

In an Example 5 that depends upon Example 4, the common mode voltage comprises circuit ground.

In an Example 6 that depends upon Example 3, the first and second switches comprise first and second transistors, respectively, and wherein a control terminal of the first and second transistors are connected together to effectuate a turning on or a turning off of the first and second transistors together.

In an Example 7 a transceiver is configured to operate in a time division duplexing fashion, and comprises a differential transmit chain having a differential line driver circuit at an output thereof, and first and second termination impedances coupled to first and second output terminals of the differential lie driver circuit, respectively. The differential line driver circuit is configured to switch between transmit and receives modes, and exhibits a first output impedance in the transmit mode and exhibits a second, different output impedance in a receive mode, wherein a magnitude of a difference between the first output impedance and a second output impedance is less than a predetermined threshold so as to substantially maintain a crosstalk performance characteristic associated therewith when the transceiver switches between the transmit mode and the receive mode.

In an Example 8 that depends upon the Example 7, the differential line driver circuit comprises an amplifier circuit having first and second differential input terminals and first and second differential output terminals, and an impedance converter circuit coupled between the first and second differential output terminals. The impedance converter circuit is configured to establish a first impedance configuration between the first and second differential output terminals in the transmit mode, and a second, different impedance confirmation between the first and second differential output terminals in the receive mode.

In an Example 9 that depends upon the Example 8, the impedance converter circuit comprises an impedance device, and a switching circuit configured to reflect a first switching configuration to manipulate the impedance device to establish the first impedance configuration in the transmit mode, and reflect a second, different switching configuration to manipulate the impedance device to establish the second impedance configuration in the receive mode.

In an Example 10 that depends upon the Example 9, the impedance devices comprises first and second impedances, and the switching circuit comprises a first switch coupled in series with the first impedance, and a second switch connected in series with the first switch at a connection node; and connected in series with the second impedance. In the first switching configuration the first and second switches are open, resulting in the impedance switching circuit operating as an open circuit at the first and second differential output terminals of the amplifier circuit.

In an Example 11 that depends upon the Example 10, in the second switching configuration the first and second switches are closed, thereby effectively connecting the first and second impedances together in series between the first and second differential output terminals of the amplifier circuit.

In an Example 12 that depends upon the Example 11, a common mode voltage is coupled to the connection node between the first and second closed switches, thereby balancing a voltage drop across the first and second impedances.

In an Example 13 that depends upon the Example 12, the common mode voltage comprises circuit ground.

In an Example 14 that depends upon the Example 11, the first and second switches comprise first and second transistors, respectively, and wherein a control terminal of the first and second transistors are connected together to effectuate a turning on or a turning off of the first and second transistors together.

In an Example 15 that depends upon the Example 8, the first impedance configuration results in an output impedance of the line driver circuit of substantially zero.

In an Example 16 that depends upon the Example 15, the second impedance configuration results in an output impedance of the line driver circuit that is less than about 20% of a termination impedance as defined by the first and second termination impedances.

In an Example 17 a method of operating a line driver circuit comprises operating an impedance converter circuit at an output of an amplifier in a transmit mode during a transmit operation, wherein the amplifier is activated, wherein the impedance converter circuit establishes a first impedance configuration during the transmit operation. The method further comprises operating the impedance converter circuit at the output of the amplifier in a receive mode during a receive operation, wherein the amplifier is deactivated, wherein the impedance converter circuit establishes a second, different impedance configuration during the receive operation, wherein a magnitude of a difference between a first output impedance of the line driver circuit based on the first impedance configuration and a second output impedance of the line driver circuit based on the second impedance configuration is less than a predetermined threshold so as to substantially maintain a crosstalk performance characteristic associated therewith when the line driver circuit switches between the transmit mode and the receive mode.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

The invention claimed is:

1. A line driver circuit having first and second differential input terminals and first and second differential output terminals, the line driver circuit configured to interface with first and second termination impedances coupled between the first and second differential output terminals, respectively, and first and second transmit chain output terminals, respectively, comprising:
    an amplifier circuit having first and second input terminals coupled to the first and second differential input terminals of the line driver circuit, respectively, and first and second output terminals directly coupled to the first and second differential output terminals of the line driver circuit, respectively;
    an impedance switching circuit coupled between the first and second output terminals of the amplifier circuit,
    wherein the impedance switching circuit is configured to switch between a first switching mode and a second switching mode;
    wherein in the first switching mode a first switching configuration is established resulting in a first output impedance at the first and second differential output terminals, wherein the first output impedance is zero; and
    wherein in the second switching mode a second switching configuration is established resulting in a second output impedance at the first and second output terminals, wherein the second output impedance is less than about 50% of a termination impedance as defined by the first and second termination impedances.

2. The line driver circuit of claim 1, wherein the second output impedance is less than about 20% of the termination impedance.

3. The line driver circuit of claim 1, wherein the impedance switching circuit comprises:
    a first impedance;
    a first switch coupled in series with the first impedance;
    a second switch connected in series with the first switch at a connection node; and
    a second impedance connected in series with the second switch,
    wherein in the first switching configuration the first and second switches are open, resulting in the impedance switching circuit operating as an open circuit at the first and second output terminals of the amplifier circuit.

4. The line driver circuit of claim 3, wherein in the second switching configuration the first and second switches are closed, thereby effectively connecting the first and second impedance together in series between the first and second output terminals of the amplifier circuit.

5. The line driver circuit of claim 4, further comprising one of a common mode voltage or a circuit ground coupled to the connection node between the first and second closed switches, thereby balancing a voltage drop across the first and second impedances.

6. The line driver circuit of claim 3, wherein the first and second switches comprise first and second transistors, respectively, and wherein a control terminal of the first and second transistors are connected together to effectuate a turning on or a turning off of the first and second transistors together.

7. The line driver circuit of claim 1, wherein the amplifier is switchable between an active mode and a power down mode, wherein the impedance switching circuit is configured to be set in the first switching mode when the amplifier is in the active mode and to be set in the second switching mode when the amplifier is in the power down mode.

8. The line driver circuit of claim 7, wherein the impedance switching circuit is configured to at least partially compensate a change of output impedance of the line driver circuit when the amplifiers switches between an active mode and an inactive mode.

9. A transceiver configured to operate in a time division duplexing fashion, comprising:
    a differential transmit chain having a line driver circuit of any one of claims 1, 2-8 at an output thereof; and
    the first and second termination impedances coupled to the first and second differential output terminals of the line driver circuit, respectively.

10. The transceiver of claim 9,
    wherein the line driver circuit is configured to switch between transmit and receives modes, and exhibits the first output impedance in the transmit mode and exhibits the second, different output impedance in a receive mode,
    wherein a magnitude of a difference between the first output impedance and a second output impedance is less than a predetermined threshold so as to substantially maintain a crosstalk performance characteristic associated therewith when the transceiver switches between the transmit mode and the receive mode.

11. The transceiver of claim 10,
    wherein the impedance switching circuit is configured to establish a first impedance configuration between the first and second differential output terminals in the first switching mode when the line driver circuit is in transmit mode, and a second, different impedance configuration between the first and second differential output terminals in the second switching mode when the line driver circuit is in receive mode.

12. A method of operating a line driver circuit, comprising:

operating an impedance switching circuit at an output of an amplifier in a transmit mode during a transmit operation, wherein the amplifier is activated, wherein the impedance switching circuit establishes a first impedance configuration during the transmit operation, the amplifier having first and second output terminals directly coupled to first and second differential output terminals of the line driver circuit, respectively; and operating the impedance switching circuit at the output of the amplifier in a receive mode during a receive operation, wherein the amplifier is deactivated, wherein the impedance switching circuit establishes a second, different impedance configuration during the receive operation;

wherein an impedance provided by the impedance switching circuit in the first impedance configuration is zero and in the second, different impedance configuration is less than 50% of an impedance provided by a termination resistance coupled to the line driver circuit.

13. The method of claim 12, wherein a magnitude of a difference between a first output impedance of the line driver circuit based on the first impedance configuration and a second output impedance of the line driver circuit based on the second impedance configuration is less than a predetermined threshold so as to substantially maintain a crosstalk performance characteristic associated therewith when the line driver circuit switches between the transmit mode and the receive mode.

14. The method of claim 12, wherein the impedance provided by the impedance switching circuit in the second impedance configuration is less than 20% of the impedance provided by the termination resistance.

* * * * *